(12) United States Patent
Chiskis

(10) Patent No.: US 7,680,869 B2
(45) Date of Patent: Mar. 16, 2010

(54) INTERPOLATION AND DECIMATION USING NEWTON POLYPHASE FILTERS

(75) Inventor: Alexander Chiskis, Tel Aviv (IL)

(73) Assignee: STMicroelectronics Ltd., Netanya (IL)

( * ) Notice: Subject to any disclaimer, the term of this patent is extended or adjusted under 35 U.S.C. 154(b) by 1386 days.

(21) Appl. No.: 11/095,244

(22) Filed: Mar. 30, 2005

(65) Prior Publication Data
US 2006/0224649 A1  Oct. 5, 2006

(51) Int. Cl.
*G06F 17/17* (2006.01)
(52) U.S. Cl. ..................................................... 708/313
(58) Field of Classification Search .......... 708/300–400
See application file for complete search history.

(56) References Cited

U.S. PATENT DOCUMENTS

| | | | | |
|---|---|---|---|---|
| 4,330,861 A * | 5/1982 | Impallomeni et al. | ........ | 375/235 |
| 4,835,723 A * | 5/1989 | Hansen | ........................ | 708/313 |
| 5,621,675 A * | 4/1997 | Linz et al. | .................... | 708/313 |
| 6,052,701 A * | 4/2000 | Koslov et al. | ............... | 708/313 |
| 6,590,510 B2 * | 7/2003 | Woog | ......................... | 708/313 |
| 6,600,495 B1 * | 7/2003 | Boland et al. | ............... | 708/300 |
| 6,625,628 B1 * | 9/2003 | Matsuura | .................... | 708/300 |
| 6,668,029 B1 * | 12/2003 | Koslov et al. | ............... | 375/350 |
| 6,993,464 B2 * | 1/2006 | Chiu et al. | ................... | 708/300 |
| 7,076,512 B2 * | 7/2006 | Buch et al. | .................. | 708/313 |
| 2002/0156820 A1 * | 10/2002 | Kishi | ........................ | 708/300 |
| 2003/0187894 A1 * | 10/2003 | Wang | ......................... | 708/313 |
| 2006/0031274 A1 * | 2/2006 | Haddadin et al. | ........... | 708/300 |
| 2006/0112157 A1 * | 5/2006 | Song | ......................... | 708/300 |

OTHER PUBLICATIONS

Crochiere, Ronald E., et al., "Multirate Digital Signal Processing", Prentice-Hall, 1983.
Vaidyanathan, "Multirate Systems and Filter Banks", Prentice-Hall, 1993.
Renfors and Saramaki, "Recursive Nth-Band Digital Filters—Part II: Design of Multistage Decimators and Interpolators", IEEE Transactions on Circuits and Systems, Jan. 1987, vol. CAS-34, No. 1.
Classen and Mecklenbrauker, "On Stationary Linear Time-Varying Systems", IEEE Transactions on Circuits and Systems, Mar. 1982, vol. CAS-29, No. 3.
Elliott, Douglas F., Handbook of Digital Signal Processing, Acadamic Press, 1987.
Crochiere, Ronald E., et al., "Multirate Digital Signal Processing", Prentice-Hall, 1983.
Vaidyanathan, "Multirate Systems and Filter Banks", Prentice-Hall, 1993.

* cited by examiner

*Primary Examiner*—Chat C Do
(74) *Attorney, Agent, or Firm*—Darby & Darby P.C.

(57) ABSTRACT

An interpolation filter for interpolating a digital signal includes a cascade of template filters, each having an identical template transfer function A(z), which is arranged to receive and filter an input sequence representing the digital signal sampled at an input sampling rate. Ancillary circuitry is coupled to the cascade so as to produce first and second phase outputs. A multiplexer is arranged to multiplex the phase outputs in order to generate an output sequence having an output sampling rate equal to twice the input sampling rate.

16 Claims, 7 Drawing Sheets

INTERPOLATION AND DECIMATION USING NEWTON POLYPHASE FILTERS

FIELD OF THE INVENTION

The present invention relates generally to digital signal processing, and particularly to methods and devices for digital interpolation and decimation.

BACKGROUND OF THE INVENTION

In many signal processing applications it is required to modify the sampling rate of a digitally-represented signal. Sampling rate conversion commonly involves the use of interpolation or decimation filters. An interpolation filter accepts a sequence of input samples having an input sampling rate and produces a sequence of output samples having a higher output sampling rate. The ratio between the output and input sampling rates is referred to as the interpolation factor. Similarly, a decimation filter accepts an input sequence and produces an output sequence having a lower output sampling rate. The ratio between the input and output sampling rates is referred to as the decimation factor.

Interpolation and decimation filters are described in a variety of publications, such as a book by Crochiere and Rabiner entitled "Multirate Digital Signal Processing," Prentice-Hall, 1983, chapter 1, pages 1-11, which is incorporated herein by reference.

Interpolation and decimation filters are sometimes implemented using polyphase configurations, for allowing the filter cells to operate at a lower sampling rate and reduce the filter computational complexity. Polyphase implementations are described by Vaidyanathan in a book entitled "Multirate Systems and Filter Banks," Prentice-Hall, 1993, section 4.3, pages 120-133, which is incorporated herein by reference.

Interpolation filters are sometimes implemented by connecting several interpolation stages in series, in order to achieve higher interpolation factors. This configuration is commonly referred to as a multistage filter. The total interpolation factor of a multistage interpolation filter is the product of interpolation factors of the individual stages. High decimation factors are also achieved in a similar fashion. Multistage interpolation and decimation filters are described in chapter 5, pages 193-250, of the book by Crochiere and Rabiner cited above. This technique is also described by Renfors and Saramaki in a paper entitled "Recursive $N^{th}$-Band Digital Filters—Part II: Design of Multistage Decimators and Interpolators," IEEE Transactions on Circuits and Systems, volume CAS-34, number 1, January 1987, pages 40-51, which is incorporated herein by reference.

There is known to be a duality between interpolation filter design and decimation filter design. This property is described in the book by Crochiere and Rabiner cited above (see in particular Chapter 3.1.3, pages 68-70). The duality principle is also described by Classen and Mecklenbräuker in a paper entitled "On Stationary Linear Time-Varying Systems," IEEE Transactions on Circuits and Systems, volume CAS-29, number 3, March 1982, pages 169-184, which is incorporated herein by reference.

SUMMARY OF THE INVENTION

Currently-available polyphase filter configurations present the designer with a trade-off between the filter performance on one hand, and the number of filter coefficients and the required coefficient quantization on the other. For example, in currently-available polyphase interpolation filters, the stop-band attenuation of the filter is directly proportional to the filter length, i.e., the number of filter coefficients. As the filter length increases, more bits are typically required to represent these coefficients adequately. Failure to allocate a sufficient number of bits to represent the coefficients typically results in high filter side-lobes, which degrade the filter stop-band attenuation.

Embodiments of the present invention provide improved polyphase interpolation and decimation filter configurations and improved methods for designing such filters. The disclosed methods and devices provide a better complexity/performance trade-off than do current-available filters, as will be shown below, and are particularly suitable for VLSI implementation.

In some embodiments, an interpolation filter comprises a basic building block, referred to as a "template filter." The interpolation filter is implemented by filtering an input data sequence using a cascade of two or more template filters. The input sequence and outputs of the cascaded template filters are delayed, weighted and combined to produce two polyphase outputs. The data sequences at the polyphase outputs are then interleaved (multiplexed) to produce an output sequence having a sampling rate that is equal to twice the input sampling rate.

In another embodiment, a multistage filter comprising two or more such interpolate-by-2 filters provides any interpolation factor of the form $2^k$.

In other embodiments, decimation filters are implemented by cascading template filters. A duality property between interpolator and decimator filter configurations is described hereinbelow.

In some disclosed embodiments, the filter structure is further simplified, and the associated computational complexity is reduced, by a special choice of coefficient values. Additionally or alternatively, the computational complexity is reduced by replacing multiplication operations with shift and add operations.

In some embodiments, interpolation filters implemented using the disclosed methods are incorporated in an analog front-end (AFE) in the transmission chain of an ADSL (Asymmetric Digital Subscriber Line) transmitter.

By using the disclosed methods and configurations, the designer can enjoy the benefits of polyphase filters, including operation at a low sampling rate, and the associated reduction in computational complexity and memory requirements. At the same time, the disclosed filter configurations provide the following benefits, compared to currently-available polyphase interpolator/decimator configurations:

1. Reduced coefficient dynamic range, due to the relatively-short length of the template filter. The reduced dynamic range enables allocating a smaller number of bits for representing the filter coefficients, a property that has particular importance in VLSI implementations.
2. High stop-band attenuation typical of long filters, due to the cascading of several template filters. The entire cascaded filter enjoys the efficiency of the polyphase representation, compared to conventional designs in which only one stage of the cascade may be polyphased.
3. Simplified VLSI design. The filter comprises a repetitive structure of identical building blocks, regardless of the overall filter order or performance.

There is therefore provided, in accordance with an embodiment of the present invention, an interpolation filter for interpolating a digital signal, including:

a cascade of template filters, each having an identical template transfer function $A(z)$, which is arranged to receive and filter an input sequence representing the digital signal sampled at an input sampling rate;

ancillary circuitry, which is coupled to the cascade so as to produce first and second phase outputs; and a multiplexer, which is arranged to multiplex the phase outputs in order to generate an output sequence having an output sampling rate equal to twice the input sampling rate.

In a disclosed embodiment, the cascade includes N template filters, and the ancillary circuitry and multiplexer are arranged so that the interpolation filter has a transfer function $H(z)=[z^{-1}+A(z^2)]^N$.

In another embodiment, the template filters are arranged to produce respective filter outputs, and the ancillary circuitry is coupled to delay, scale and combine the input sequence and the filter outputs in order to produce the first and second phase outputs.

Additionally or alternatively, the ancillary circuitry is operative to scale each of the filter outputs by a multiplicative coefficient $$C_k = \binom{N}{k} = \frac{N!}{k!(N-k)!},$$

wherein k is an index indicating an order of the template filters in the cascade.

Further additionally or alternatively, the ancillary circuitry is operative to scale each of the filter outputs by performing one or more shift and add operations.

In another embodiment, the template filters and the ancillary circuitry are arranged to operate at the input sampling rate.

In yet another embodiment, the cascade, ancillary circuitry and multiplexer are implemented in an application-specific integrated circuit (ASIC).

In still another embodiment, $A(z)=(a+z^{-1})/(1+az^{-1})$, wherein a is a constant.

There is also provided, in accordance with an embodiment of the present invention, a multistage interpolation filter for interpolating a digital signal, including two or more interpolation filters connected in series, the interpolation filters including at least:

a first interpolation filter, which includes:

a first cascade of first template filters, each having an identical first stage template transfer function $A_1(z)$, which is arranged to receive and filter an input sequence representing the digital signal sampled at an input sampling rate;

first ancillary circuitry, which is coupled to the first cascade so as to produce first and second phase outputs; and a first multiplexer, which is arranged to multiplex the first and second phase outputs in order to generate a first output sequence having a first output sampling rate equal to twice the input sampling rate; and a second interpolation filter, which includes:

a second cascade of second template filters, each having an identical second stage template transfer function $A_2(z)$, which is arranged to receive and filter the first output sequence at the first output sampling rate;

second ancillary circuitry, which is coupled to the second cascade so as to produce third and fourth phase outputs; and a second multiplexer, which is arranged to multiplex the third and fourth phase outputs in order to generate a second output sequence having a second output sampling rate equal to twice the first output sampling rate.

In a disclosed embodiment, at least the first and second stage template transfer functions are different from one other.

There is additionally provided, in accordance with an embodiment of the present invention, a decimation filter for decimating a digital signal, including:

a demultiplexer, which is arranged to demultiplex an input sequence representing the digital signal sampled at an input sampling rate, so as to produce first and second phase inputs;

ancillary circuitry, which is coupled to process the first and second phase inputs, so as to produce a set of weighted inputs; and a cascade of template filters, each having an identical template transfer function $A(z)$, which are arranged to filter the weighted inputs so as to generate an output sequence having an output sampling rate equal to half the input sampling rate.

There is further provided, in accordance with an embodiment of the present invention, an analog front-end circuit for converting a digital discrete multi-tone (DMT) signal to an analog signal, including:

one or more interpolation filters, which are arranged to receive and interpolate the digital DMT signal so as to produce an interpolated signal, each interpolation filter including:

a cascade of template filters, each having an identical template transfer function $A(z)$, which is arranged to receive and filter an input sequence representing the digital signal sampled at an input sampling rate;

ancillary circuitry, which is coupled to the cascade so as to produce first and second phase outputs; and a multiplexer, which is arranged to multiplex the phase outputs in order to generate an output sequence having an output sampling rate equal to twice the input sampling rate; and a digital-to-analog converter, which is arranged to convert the interpolated signal to an analog signal.

In a disclosed embodiment, the one or more interpolation filters include a plurality of the interpolation filters connected in series.

There is additionally provided, in accordance with an embodiment of the present invention, a method for interpolating a digital signal, including:

receiving an input sequence representing the digital signal sampled at an input sampling rate;

filtering the input sequence using a cascade of template filters each having an identical template transfer function $A(z)$;

processing the input sequence and outputs of the template filters so as to produce first and second phase outputs; and multiplexing the phase outputs in order to generate an output sequence having an output sampling rate equal to twice the input sampling rate.

There is also provided, in accordance with an embodiment of the present invention, a method for decimating a digital signal, including:

receiving an input sequence representing the digital signal sampled at an input sampling rate;

demultiplexing the input sequence, so as to produce first and second phase inputs;

processing the first and second phase inputs using ancillary circuitry, so as to produce weighted inputs; and filtering the weighted inputs using a cascade of template filters each having an identical template transfer function $A(z)$, so as to generate an output sequence having an output sampling rate equal to half the input sampling rate.

The present invention will be more fully understood from the following detailed description of the embodiments thereof, taken together with the drawings in which:

DETAILED DESCRIPTION OF EMBODIMENTS

Figure 1:
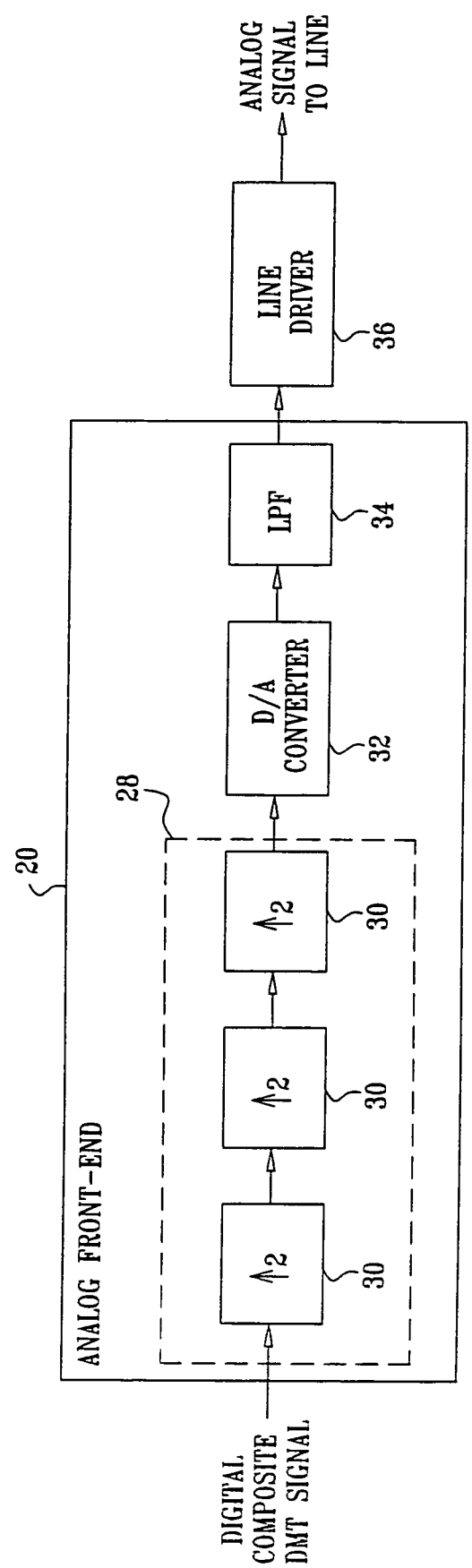
FIG. 1 is a block diagram that schematically illustrates parts of an ADSL transmitter, in accordance with an embodiment of the present invention.

FIG. 1 is a block diagram that schematically illustrates parts of an ADSL transmitter, in accordance with an embodiment of the present invention. In this embodiment, polyphase interpolation filters are used for multiplying the sampling rate of a digital Discrete Multi-Tone (DMT) signal that comprises multiple modulated tones, according to the ADSL specification. (Additional details regarding the different DSL standards can be found at www.dslforum.org.)

The ADSL transmitter shown in FIG. 1 comprises an analog front-end (AFE) 20 that receives a digital composite DMT signal and converts it to an analog signal suitable for transmission over a telephone line. The AFE is typically implemented in a mixed-signal Application-Specific Integrated Circuit (ASIC). The AFE comprises a multistage interpolation filter 28 comprising three interpolation filters 30. The interpolation filters are implemented using methods described herein. Multistage interpolation filters are further explained in the description of FIG. 7 below. Additionally or alternatively, one or more of filters 30 may have different orders or different transfer functions and thus comprise different coefficients, as will be shown below.

In the example of FIG. 1, multistage filter 28 accepts an input sequence of digital samples representing the DMT signal, having an input sampling rate of 4.416 MHz. Each interpolation filter 30 performs interpolation by a factor of 2. In total, multistage filter 28 performs interpolation by a factor of 8 producing an output sequence having an output sampling rate of 35.328 MHz.

A Digital-to-Analog (D/A) converter 32 converts the interpolated signal at the output of multistage filter 28 into an analog signal. The analog signal is filtered by a Low-Pass Filter (LPF) 34 that suppresses harmonics, image signals and other spurious signals generated by the D/A converter. The filtered analog signal is fed to a line-driver 36, which performs impedance matching and adjusts the output signal to the appropriate level before transmitting the signal over the telephone line.

The configuration of multistage filter 28 described above enables efficient VLSI implementation of the ADSL AFE. For example, the power consumption of the ASIC is reduced because of the lower sampling rate. As a consequence, the ASIC heat dissipation is also improved. Additionally, the lower sampling rate enables the use of low-leakage cells in the ASIC implementation, which provides an additional saving in power consumption.

The exemplary ADSL AFE configuration of FIG. 1 was chosen purely for the sake of conceptual clarity. The methods and devices described herein may also be used to implement interpolation and decimation filters for a variety of additional applications, which will be apparent to those skilled in the art.

The Template Filter

Figure 2:
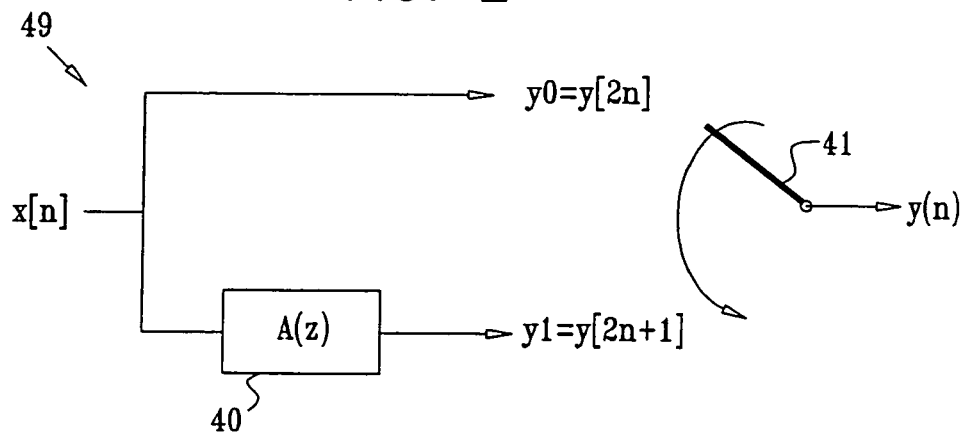
FIGS. 2-6 are block diagrams that schematically illustrate polyphase interpolation filters, in accordance with embodiments of the present invention.
Figure 9:
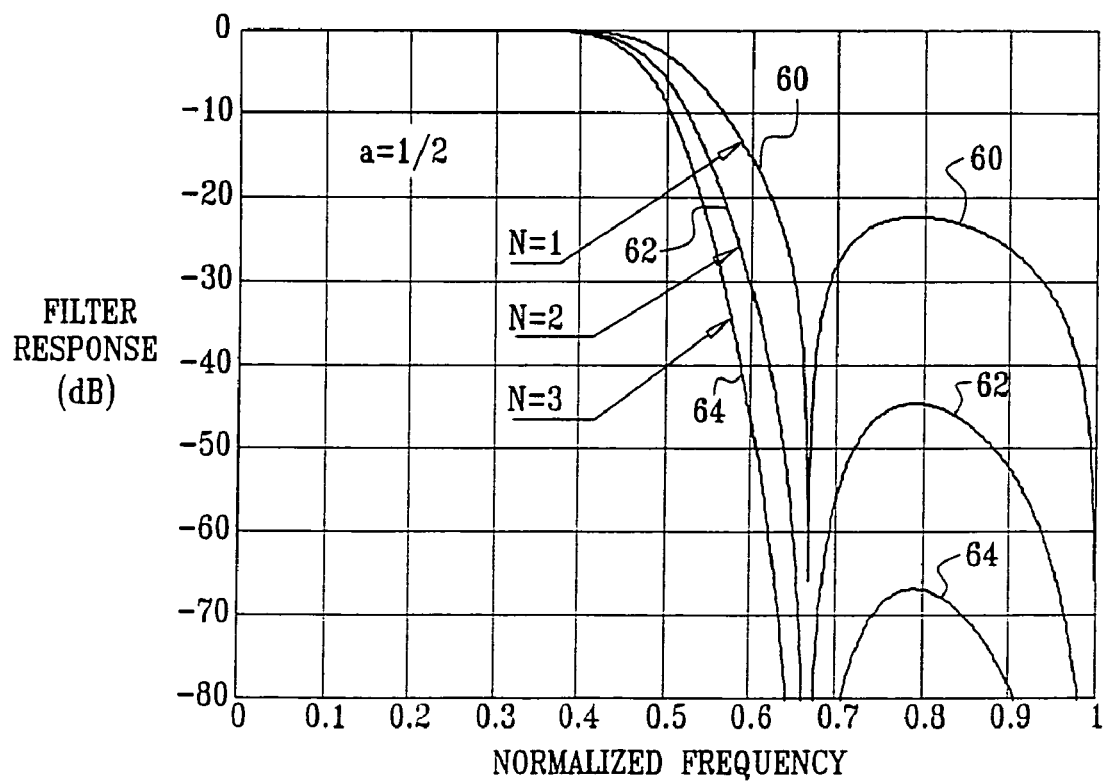
FIG. 9 is a plot that schematically illustrates spectral responses of polyphase interpolation filters, in accordance with embodiments of the present invention.

FIG. 2 is a block diagram that schematically illustrates a polyphase interpolation filter 49, in accordance with an embodiment of the present invention. Filter 49 performs interpolation by a factor of 2, and as such may be used to implement filter 30 of FIG. 1. The filter typically has a half-band frequency response, i.e., has low pass-band attenuation (insertion loss) in frequencies lower than half the normalized Nyquist frequency, and high stop-band attenuation (rejection), or frequencies higher than half the normalized Nyquist frequency. (Typical half-band frequency responses are shown in the curves of FIG. 9 below.)

Interpolation filters may be represented and implemented as polyphase structures having a z-space transfer function of the form $H(z)=H_0(z^2)+z^{-1} \cdot H_1(z^2)$. In this representation, the filter comprises two parallel branches, or phases. The input sequence is first up-sampled. (Typically, a zero sample is inserted between every two original samples. This process is also called "zero stuffing"). Two parallel transfer functions $H_0(z^2)$ and $H_1(z^2)$ are applied to the up-sampled input sequence, with the phase of $H_1(z^2)$ being delayed by one sample interval compared to the phase of $H_0(z^2)$. (This delay is the time-domain equivalent of multiplying by $z^{-1}$.) The two filters implementing $H_0(z^2)$ and $H_1(z^2)$ operate at the (higher) output sampling rate. The filtered outputs of the two phases are summed to produce the interpolated output sequence.

An equivalent implementation of the filter $H(z)=H_0(z^2)+z^{-1} \cdot H_1(z^2)$ may be produced by using the well-known "Noble identities." According to this equivalent implementation, the input sequence is first filtered in parallel by two transfer functions $H_0(z)$ and $H_1(z)$, without up-sampling. The two transfer functions are identical to the transfer functions of the original configuration. However, in this case these filters operate at the (lower) input sampling rate, and are thus functions of z and not of $z^2$. The outputs of the two phases are interleaved (multiplexed) to produce an output sequence having an output sampling rate equal to twice the input sampling rate.

This implementation has significant practical advantages, enabling the two filters $H_0$ and $H_1$ to operate at the lower input sampling rate. Since the input sequence is not up-sampled, $H_0$ and $H_1$ process only half of the original number of samples, requiring less memory and computations. Using filters that are functions of z and not of $z^2$ also effectively reduces the order of these filters, which results in lower memory requirements. When the filters are implemented in an ASIC, the lower memory requirements are translated to reduced power consumption and a smaller die area. The use of the Noble identities and the two equivalent filter configurations are described in detail in Section 4.2, pages 118-120, of the book by Vaidyanathan cited above.

For implementing the disclosed filter configurations, the general form of H(z) given above is slightly narrowed. Interpolation filter 49 is chosen to have a z-space transfer function of the form $H(z)=\frac{1}{2}(z^{-1}+A(z^2))$, wherein A(z) is an arbitrary filter referred to as a "template filter" 40.

A typical example of an interpolator filter having this form is a third-order half-band filter given by $H(z)=\frac{1}{2}(z^{-1}+((a+z^{-2})/(1+az^{-2})))$, wherein a is a predetermined filter coefficient and the template filter is $A(z^2)=(a+z^{-2})/(1+az^{-2})$.

It can be seen that $A(z)$ is a function of $z^2$, implying that the filter operates at the (higher) output sampling rate. By using the Noble identities described above, the filter represented by $H(z)=\frac{1}{2}(z^{-1}+A(z^2))$ may be implemented using the equivalent configuration in which the template filter $A(z)$ is a function of z and not of $z^2$. In this configuration, as shown in FIG. 2, the template filter operates at the (lower) input sampling rate and the summing of the two phases is replaced by interleaving of their outputs.

Referring to the block diagram in FIG. 2, an input sequence x(n) is passed simultaneously to two parallel phases, or branches, of filter 49. The first phase comprises the input sequence x(n) itself, denoted $y_0$. In the second phase, the input sequence is filtered by template filter 40, having a transfer function A(z), to produce a sequence denoted $y_1$. As noted above, template filter 40 operates at the lower input sampling rate. Therefore, each of the sequences $y_0$ and $y_1$ has the same sampling rate as the input sequence x(n). A multiplexer 41, operating at twice the input sampling rate, interleaves the two sequences $y_0$ and $y_1$ to produce an output sequence denoted y(n) having a sampling rate that is twice the sampling rate of the input sequence x(n). The resulting output sequence at the output of multiplexer 41 is thus an interpolation by a factor of two of x(n).

Cascading Interpolation Stages

The configuration of filter 49 described in FIG. 2 above provides a certain level of stop-band rejection, as dictated by the performance of template filter 40. In order to increase the stop-band rejection of filter 49, several interpolator stages may be cascaded. Each interpolator stage in the cascade has a z-space transfer function of the form $H(z)=\frac{1}{2}(z^{-1}+A(z^2))$, as described above. Cascading N such interpolation stages provides a total transfer function $\{H(z)\}^N$, or explicitly $\{\frac{1}{2}(z^{-1}+A(z^2))\}^N$. The resulting stop-band rejection is N times higher than the rejection of the single-stage filter of FIG. 2. However, the transfer function of this cascade cannot be readily represented as a polyphase structure. The following paragraphs describe a method for implementing interpolation filters comprising several cascaded interpolation stages, in a polyphase configuration.

Figure 3:
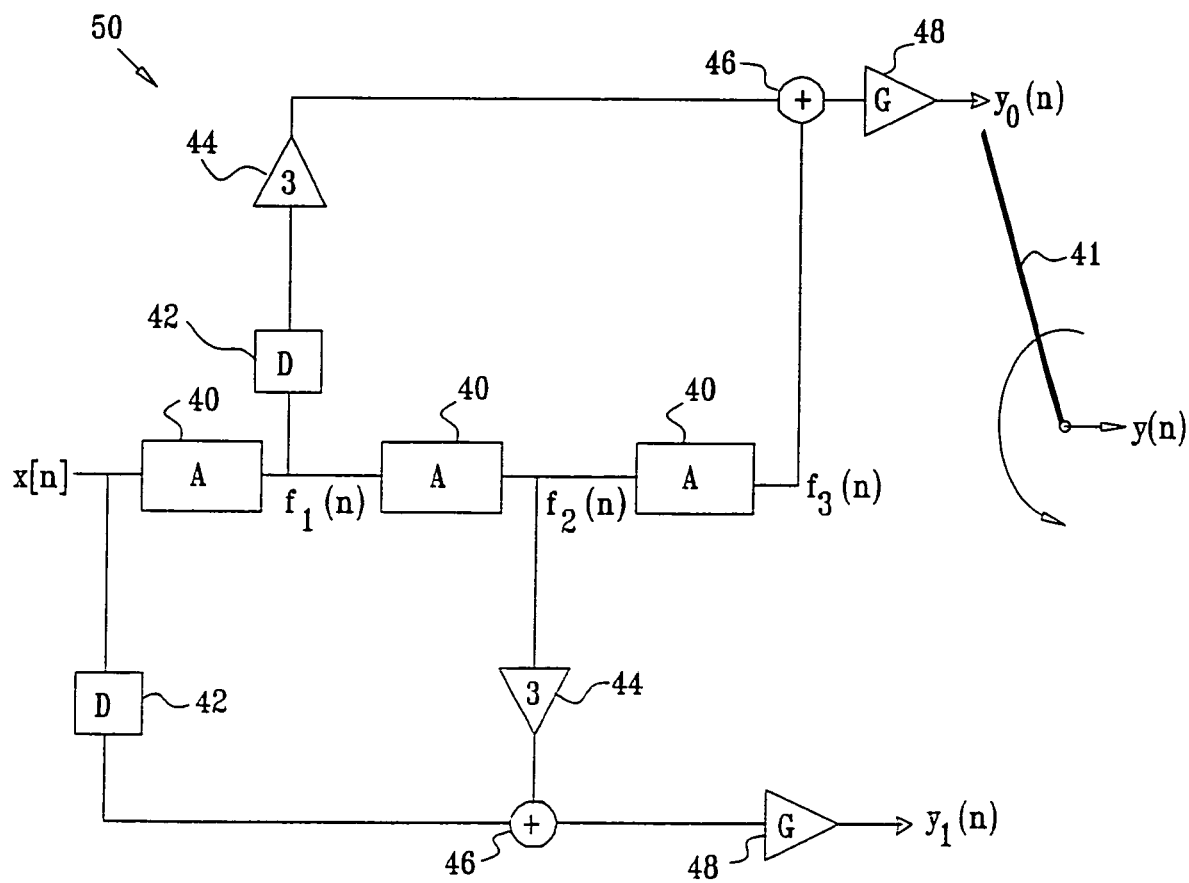

FIG. 3 is a block diagram that schematically illustrates an interpolation filter 50 for N=3, in accordance with an embodiment of the present invention. Filter 50 performs interpolation by 2, and as such may be used to implement filter 30 of FIG. 1. As will be shown below, the filter shown in FIG. 3 is functionally equivalent to a cascade of three successive interpolation filters of the form $H(z)=\frac{1}{2}(z^{-1}+A(z^2))$. In order to explain the configuration of FIG. 3, consider the explicit z-space transfer function of interpolation filter 50, given by $H(z)=G\cdot[z^{-1}+A(z^2)]^3$. G is a multiplicative gain constant used for maintaining the Root Mean Square (RMS) magnitude of the output sequence compared to the input sequence (in other words, maintaining a gain of unity). Performing the explicit calculation, H(z) is given by:

$$H(z) = G \cdot \{[A(z^2)]^3 + 3z^{-1}[A(z^2)]^2 + 3z^{-2}A(z^2) + z^{-3}\}$$
$$= G \cdot \{[A(z^2)]^3 + 3z^{-2}[A(z^2)]^2\} + G \cdot z^{-1} \cdot \{3[A(z^2)]^2 + z^{-2}\}$$
$$\equiv H_0(z^2) + z^{-1}H_1(z^2)$$

The transfer function H(z) is thus expressed as a polyphase—the sum of two phases $H_0(z^2)$ and $H_1(z^2)$, with $H_1(z^2)$ delayed by one sample interval. Using the Noble identities cited above, substituting z for $z^2$, the transfer functions of the two phases are given by:

$$H_0(z) = G \cdot \{[A(z)]^3 + 3z^{-1}A(z)\}$$

$$H_1(z) = G \cdot \{3[A(z)]^2 + z^{-1}\}$$

It can be seen already that the two phases of filter 50 are expressed in terms of powers of the template filter transfer function A(z), implying a cascade of template filters.

Returning to the description of FIG. 3, interpolation filter 50 comprises three template filters 40 connected in cascade. The input sequence x(n) and the outputs of the three template filters are processed by ancillary circuitry to produce two polyphase output sequences denoted $y_0(n)$ and $y_1(n)$. Specifically, in this embodiment, the input sequence and template filter outputs are appropriately delayed using unit delays 42, weighted by a factor of 3 using coefficients 44, combined using summers 46 and multiplied by a gain factor 48. As in FIG. 2 above, the two polyphase output sequences $y_0(n)$ and $y_1(n)$ are interleaved by multiplexer 41 to produce the output sequence y(n).

We shall now show that the two phases of filter 50 in FIG. 3 have respective z-space transfer functions equal to $H_0(z)$ and $H_1(z)$ given above. In order to prove this result, we shall express the two polyphase output sequences $y_0(n)$ and $y_1(n)$ in terms of the input sequence x(n) and the response of template filter 40, denoted A. Let $f_1(n)$, $f_2(n)$ and $f_3(n)$ denote the outputs of the first, second and third template filters 40 in the cascade, respectively. Let $F_1(z)$, $F_2(z)$ and $F_3(z)$ denote the z-transforms of $f_1(n)$, $f_2(n)$ and $f_3(n)$, respectively. It can be seen that $$F_1(z) = A(z) \cdot X(z)$$

$$F_2(z) = [A(z)]^2 \cdot X(z)$$

$$F_3(z) = [A(z)]^3 \cdot X(z)$$

wherein X(z) denotes the z-transform of the input sequence x(n). Following the signal flow of FIG. 3, we can write $$y_0(n) = G \cdot \{f_3(n) + 3f_1(n-1)\}$$

$$y_1(n) = G \cdot \{3f_2(n) + x(n-1)\}$$

Taking the z-transform of the expression for $y_0(n)$ gives:

$$Y_0(z) = G \cdot \{F_3(z) + 3z^{-1}F_1(z)\}$$
$$= G \cdot \{[A(z)]^3 \cdot X(z) + 3z^{-1}A(z)X(z)\}$$
$$= G \cdot \{[A(z)]^3 + 3z^{-1}A(z)\} \cdot X(z)$$
$$= H_0(z) \cdot X(z)$$

wherein $H_0(z)$ is the same transfer function of the first phase of the polyphase expression given above.

Similarly, taking the z-transform of the expression for $y_1(n)$ gives:

$$Y_1(z) = G \cdot \{3F_2(z) + z^{-1} \cdot X(z)\}$$
$$= G \cdot \{3[A(z)]^2 + z^{-1}\} \cdot X(z)$$
$$= H_1(z) \cdot X(z)$$

wherein $H_1(z)$ is the same transfer function of the second phase of the polyphase expression given above.

To summarize the case of N=3, we have shown that the configuration of interpolator filter 50, as described by FIG. 3, indeed implements the transfer function $H(z)=G\cdot[z^{-1}+A(z^2)]^3$, which is equivalent to three interpolation filters of the form $H(z)=\frac{1}{2}(z^{-1}+A(z^2))$ connected in cascade. Therefore, filter 50 is indeed a polyphase interpolation filter having stop-band rejection that is three times higher than single-stage interpolation filter 49 of FIG. 2 above. Filter 50 comprises the same template filter 40, cascaded three times.

Figure 4:
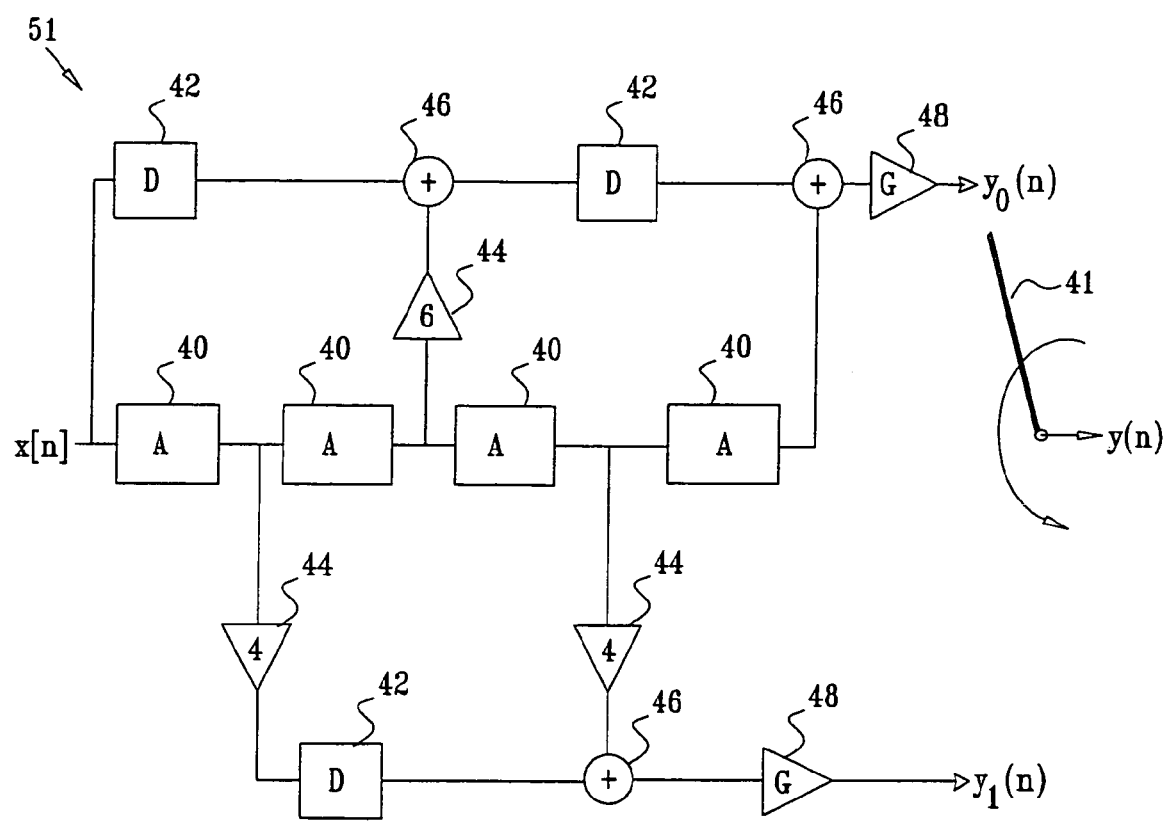

FIG. 4 is a block diagram that schematically illustrates interpolation filter 51 for N=4, in accordance with an embodiment of the present invention. Similarly to filter 50 of FIG. 3, filter 51 also performs interpolation by 2, and as such may be used to implement filter 30 of FIG. 1. Whereas the preceding description of FIG. 3 demonstrated odd values of N, the example of FIG. 4 serves to demonstrate even-order cascades. Filter 51 shown in FIG. 4 comprises four template filters 40 connected in cascade. The input sequence x(n) and the outputs of the four template filters are appropriately delayed using unit delays 42, weighted by 4 using coefficients 44, combined using summers 46 and multiplied by gain factor 48 to produce the two polyphase output sequences $y_0(n)$ and $y_1(n)$. As in FIGS. 2 and 3 above, sequences $y_0(n)$ and $y_1(n)$ are interleaved by multiplexer 41 to produce the interpolated output sequence y(n).

Following a similar sequence of calculations to the one performed in the description of FIG. 3 above, the z-space transfer function $H(z)=G^{-1}[z^{-1}+A(z^2)]^4$, describing a cascade of four interpolation filter stages, can be transformed into a polyphase structure with the following transfer functions:

$$H_0(z)=G\cdot\{[A(z)]^4+6z^{-1}[A(z)]^2+z^{-2}\}$$

$$H_1(z)=G\cdot\{4[A(z)]^3+4z^{-1}A(z)\}$$

Following the signal flow of FIG. 4, the two phases of interpolation filter 51 can be similarly shown to have a transfer functions equal to $H_0(z)$ and $H_1(z)$ above.

Generalized Polyphase Configuration

Figure 5:
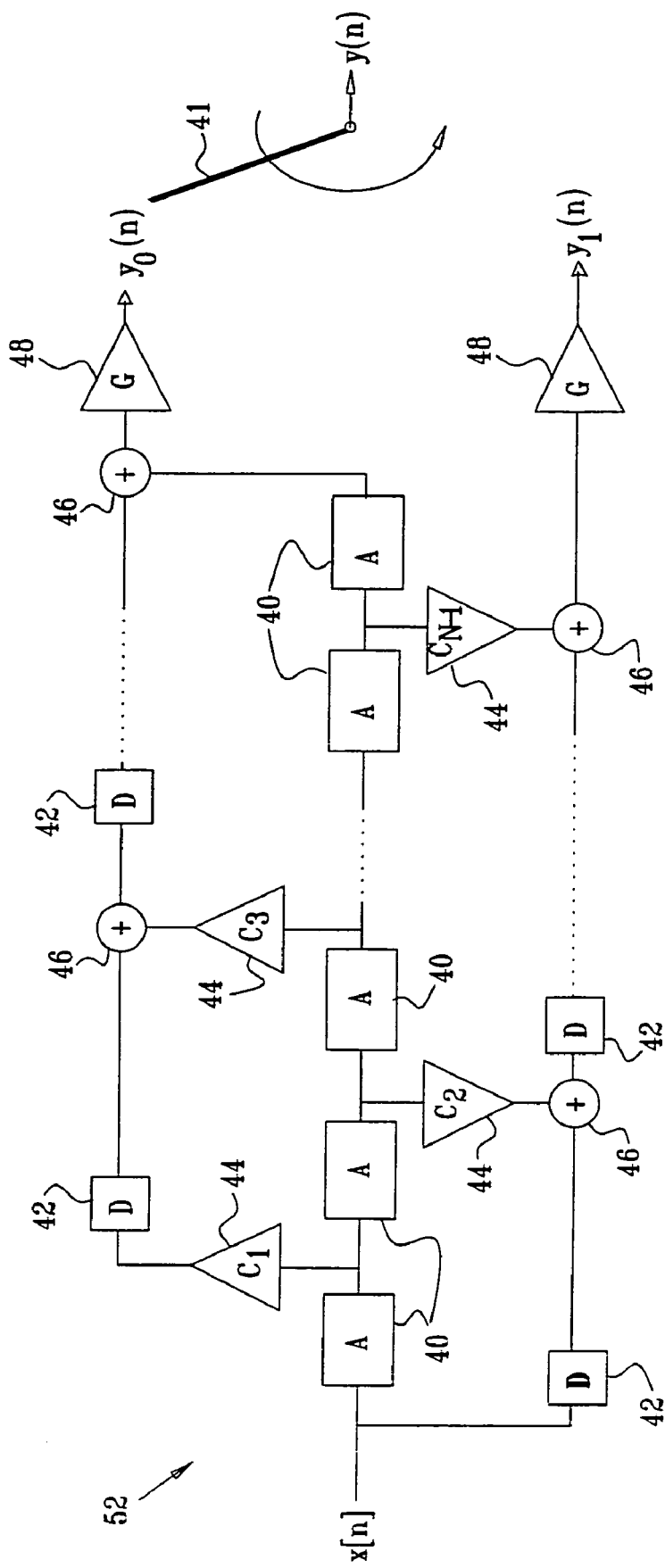
Figure 6:
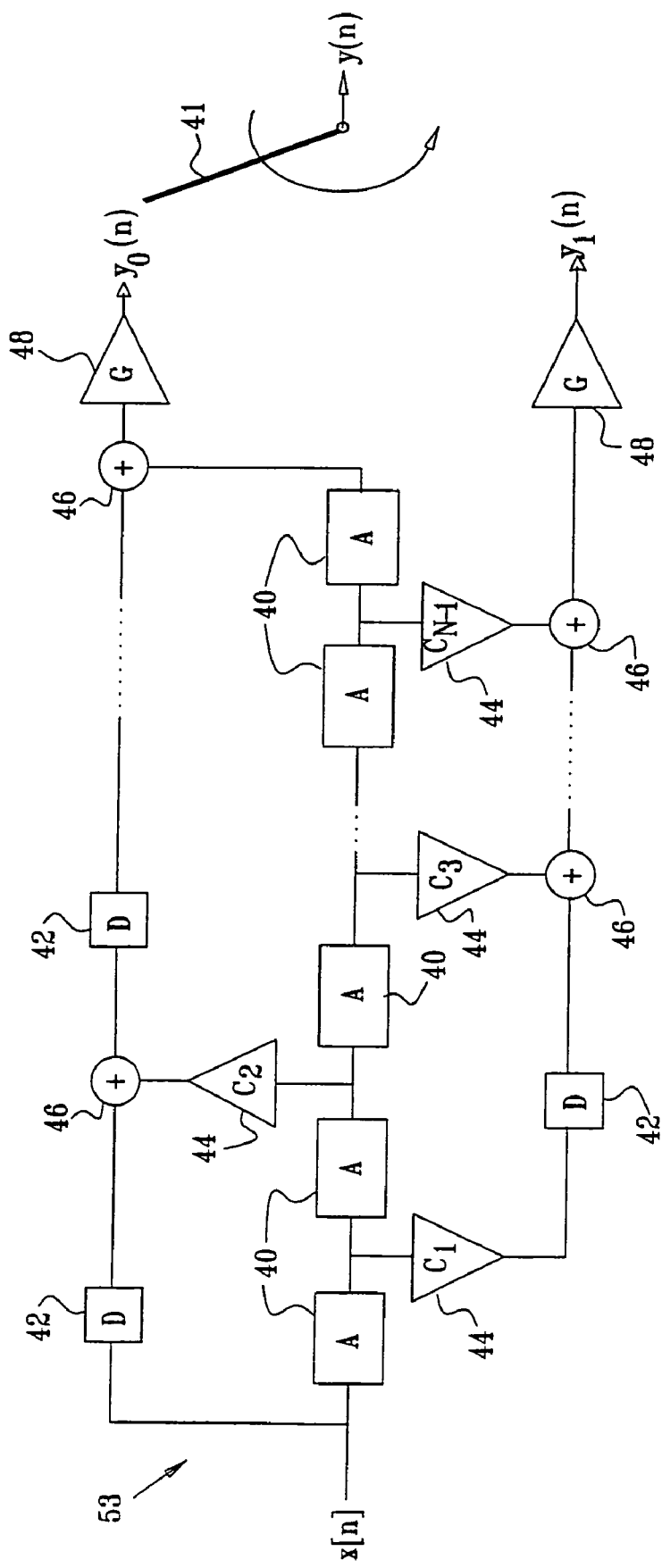

FIGS. 5 and 6 are block diagrams that schematically illustrate generalized configurations of interpolation filters of order N, in accordance with embodiments of the present invention. FIG. 5 shows a filter 52, which is the generalized configuration for odd values of N. FIG. 6 shows a filter 53, which is the configuration used for even values of N. Once again, any one of filters 52 and 53 may be used to implement filter 30 of FIG. 1.

In the generalized case, the interpolation filter comprises N template filters 40 connected in cascade. The input sequence x(n) and the outputs of the N template filters are delayed using unit delays 42, weighted using N−1 coefficients 44 denoted $C_1, \ldots, C_{N-1}$, combined using summers 46 and multiplied by gain factor 48, to produce the two polyphase output sequences $y_0(n)$ and $y_1(n)$. The sequences $y_0(n)$ and $y_1(n)$ are interleaved by multiplexer 41 to produce the output sequence y(n).

The transfer function of the generalized interpolation filter (applicable both to odd-order filter 52 and to even-order filter 53) is given by:

$$G^{-1}\cdot H(z) = (z^{-1}+A(z^2))^N = \sum_{k=0}^{N} C_k z^{-k} A^{N-k}(z^2)$$

wherein filter coefficients 44, denoted $C_k$, are given by the Newton binomial sequence (hence the name "Newton polyphase filter"):

$$C_k = \binom{N}{k} = \frac{N!}{k!(N-k)!}, k = 0, \ldots, N$$

(Since $C_0=C_N=1$, these two coefficients are not shown explicitly in the figures.) Separating the odd and even powers of $z^{-1}$ in the expression for $G^{-1}\cdot H(z)$ gives the two polyphase output sequences $y_0(n)$ and $y_1(n)$ (after having replaced $z^2$ with z according to the Noble identities):

$$y_0(n) = \sum_{k=0}^{\lceil\frac{N-1}{2}\rceil} C_N^{2k} f_{N-2k}(n-k)$$

$$y_1(n) = \sum_{k=0}^{\lfloor\frac{N-1}{2}\rfloor} C_N^{2k+1} f_{N-(2k+1)}(n-k)$$

wherein $f_0(n)\equiv x(n)$, $f_i(n)$ denotes the output of the $i^{th}$ template filter 40 in the cascade, $\lceil p\rceil$ denotes ceil (p) (the smallest integer larger than p), and $\lfloor p\rfloor$ denotes floor (p) (the largest integer smaller than p). For example, for N=3:

$$\left\lfloor\frac{N-1}{2}\right\rfloor = \left\lfloor\frac{3-1}{2}\right\rfloor = \lfloor 1\rfloor = 1, \quad \left\lceil\frac{N-1}{2}\right\rceil = \left\lceil\frac{3-1}{2}\right\rceil = \lceil 1\rceil = 1$$

Similarly, for N = 4:

$$\left\lfloor\frac{N-1}{2}\right\rfloor = \left\lfloor\frac{4-1}{2}\right\rfloor = \left\lfloor\frac{3}{2}\right\rfloor = 1, \quad \left\lceil\frac{N-1}{2}\right\rceil = \left\lceil\frac{4-1}{2}\right\rceil = \left\lceil\frac{3}{2}\right\rceil = 2$$

which is in agreement with the examples of FIGS. 3 and 4 above.

When cascading multiple filters, the pass-band ripples of these filters accumulate and produce a larger total pass-band ripple. Therefore, in applications that require a flat pass-band, the template filter may have to be specified accordingly.

Higher Interpolation Factors

Figure 7:
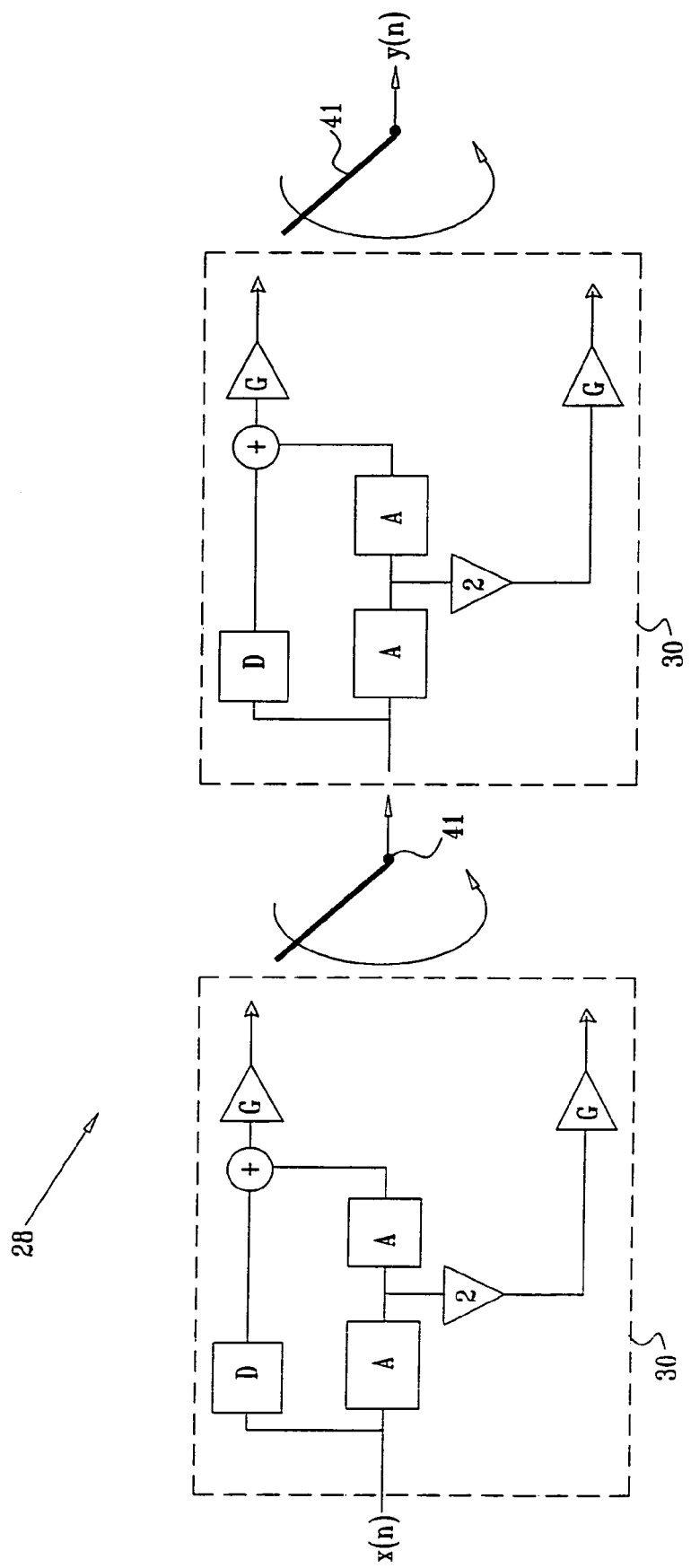
FIG. 7 is a block diagram that schematically illustrates a multistage polyphase interpolation filter, in accordance with an embodiment of the present invention.

FIG. 7 is a block diagram that schematically illustrates multistage interpolation filter 28, in accordance with an embodiment of the present invention. The examples shown in FIGS. 2-6 above relate to filters used for performing interpolation by a factor of two. In some applications it is desirable to provide interpolation factors higher than two, such as in the ADSL analog front-end example of FIG. 1 above. For this purpose, two or more interpolation filters may be connected in series to form a multistage filter. Each filter performs interpolation by two. The total interpolation factor of multistage filter 28 is the product of the interpolation factors of the individual stages. The sampling rate increases along the series of filters, since the input sampling rate of each filter is equal to the output sampling rate of the preceding filter.

In the example of FIG. 7, multistage filter 28 comprises two filters 30 to provide a total interpolation factor of 4. Alternatively, multistage filter 28 may comprise any number of interpolation filters. Additionally or alternatively, filters 30 may comprise filters of any order, such as filters 49-53 described above. In general, a series connection of k filters provides a total interpolation factor of $2^k$. Additionally or alternatively, one or more of the filters in multistage filter 28 may have a different template filter transfer function A(z).

A multistage filter comprising several shorter filter stages is often preferred over the alternative of applying a single, longer filter. Shorter filters typically reduce the overall computational complexity and power consumption of the multistage filter. In addition, each stage is simpler, has more relaxed filtering requirements and can often use simpler coefficient representation.

Applying filter stages having different transfer functions often simplifies the design of the multistage filter. In many cases, when designing a multistage interpolator, the filtering requirements of the first stage are the toughest. These requirements may typically be relaxed when moving forward along the multistage, since the frequencies of image products filtered by each consecutive stage move further apart. This relaxation can be translated to a lower stage filter order, a "softer" transfer function and/or to lower coefficient precision. The relaxed filter requirements typically translates to savings in computational complexity, power consumption and die size.

Duality Between Decimation and Interpolation

As noted above, there is a duality between the structure of an interpolation filter and the structure of a decimation filter. According to the book by Crochiere and Rabiner cited above, an interpolation filter may be transformed into a decimation filter by performing the following transformation steps:

Convert each summer 46 to a branching point.
Convert each branching point to a summer 46.
Linear time-invariant branch operations (such as delays 42, coefficients 44 and template filters 40) remain unchanged.
Reverse all signal flow directions.

Using this conversion method, the polyphase interpolation filter configurations described in FIGS. 2-6 may be transformed into decimation filters. The same benefits provided by the interpolation filter configurations are equally provided by the respective decimation filter configurations.

Figure 8:
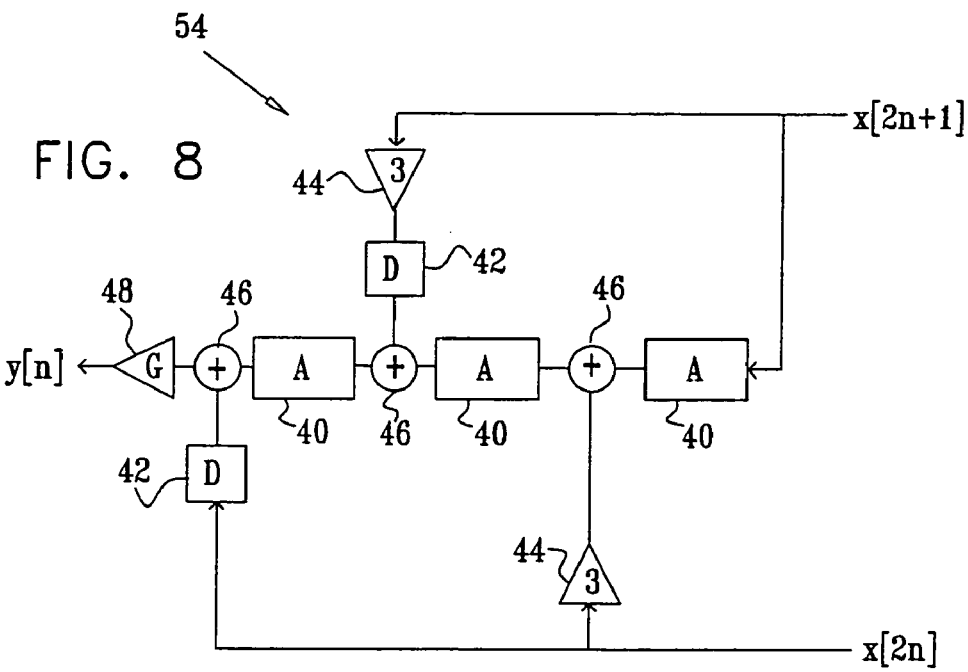
FIG. 8 is a block diagram that schematically illustrates a polyphase decimation filter, in accordance with an embodiment of the present invention.

FIG. 8 is a block diagram that schematically illustrates a polyphase decimation filter 54 for N=3, in accordance with an embodiment of the present invention. Filter 54 was designed by transforming interpolation filter 50 for N=3, as shown in FIG. 3, using the transformation steps described above.

The signal flow direction in filter 54 is reversed relative to filter 50 of FIG. 3. The input sequence x(n) is separated into even and add input sequences denoted x(2n) and x(2n+1), reversing the operation of multiplexer 41. Summers 46 of FIG. 3 have been transformed into branching points, and vice versa. The odd and even sequences are appropriately multiplied by coefficients 44, delayed by unit delays 42, and added into the cascade of three template filters 40 using summers 46. The output of the cascade is multiplied by gain factor 48 to produce the decimated output sequence y(n). The decimated output sequence y(n) operates at the same sampling rate as each of the even and odd sequences x(2n) and x(2n+1). Thus, y(n) is a decimation-by-2 of x(n).

The value of gain factor 48 in decimation filter 54 is typically half of the corresponding value in interpolation filter 50. The reason for choosing this gain value is that for practical input sample sequences, the RMS magnitude of the signal does not change during decimation. The interpolation process, on the other hand, can be viewed as "zero stuffing" (adding a zero sample between every two input samples) followed by low-pass filtering. This process reduces the average magnitude of the samples by a factor of two, which should be compensated by gain factor 48.

The example of FIG. 8 shows a decimation filter comprising three template filters. However, the same method may be used to convert a polyphase interpolator filter comprising any number of template filters into a corresponding decimation filter.

In another embodiment (not shown in the figures), two or more decimation filters 54 may be connected in a multistage connection in order to provide a higher total decimation factor. Any number of decimation filters 54 may be connected in this manner. Connecting k decimation filters in a multistage configuration, each filter decimating by a factor of 2, provides a total decimation factor of $2^k$. Additionally or alternatively, one or more of decimation filters 54 in the series may comprise a different template filter 40. Refer also to the description of multistage interpolation filters in FIG. 7 above.

Computational Complexity Considerations

When implementing the filter configurations described herein, one of the more computationally-costly tasks is the multiplication of a sample by filter coefficient 44. This computational cost may be reduced by replacing "costly" multiplication operations with "low-cost" shift and add operations. For example, consider coefficients 44 of filter 30 for different values of N (from the descriptions of FIGS. 2-6 above):

N=2 {1,2,1}
N=3 {1,3,3,1}
N=4 {1,4,6,4,1}
N=5 {1,5,10,10,5,1}

For coefficient values that are powers of two (e.g., 2 or 4), no multiplication is necessary. Multiplying a sample by $2^k$ is equivalent to shifting the sample, represented as a binary number, k times to the left. The other coefficient values may be represented as sums of powers of two. For example: $3=2^0+2^1$, $5=2^0+2^2$, $6=2^1+2^2$ and $10=2^1+2^3$. When a filter coefficient is represented as a sum of powers of two, multiplication may be replaced by summing shifted replicas of the multiplied sample. For example, multiplying a binary sample x by 10 may be implemented by adding a replica of x shifted once (2x) to a replica of x shifted 3 times (8x).

Utilizing this representation of the filter coefficients, the following table gives the number of additions required for multiplying coefficients 44 in a single cycle of filter 30, for different values of N:

| N | Additions |
|---|---|
| 2 | 1 |
| 3 | 4 |
| 4 | 4 |
| 5 | 6 |

When filter coefficients 44 are implemented without multiplications, the total complexity of calculating a single cycle of filter 30 is the number of additions described above, plus N times the complexity of calculating the output of the template filter itself. Therefore, the computational complexity of filtering by template filter 40 has a significant contribution to the overall computational complexity of interpolation filter 30.

Consider, for example, the exemplary third-order half-band filter mentioned above, having a z-space transfer function $H(z)=\frac{1}{2}(z^{-1}+((a+z^{-2})/(1+az^2)))$, wherein a is a predetermined filter coefficient, and the template filter is given by $A(z^2)=(a+z^{-2})/(1+az^{-2})$. The time-domain response of A(z) is given by $y(n)=x(n-1)+a\cdot[(x(n)-y(n-1)]$. For arbitrary values of the coefficient a, each cycle of filtering requires one multiplication.

However, if multiplication by a can be implemented as a pure shift (for example, $a=\frac{1}{2}$, wherein multiplication is equivalent to a right-shift), then the response of template filter 40 can be calculated using only shift and add operations. For example, with $a=\frac{1}{2}$ the calculation amounts to two additions (one addition and one subtraction). Other values of a may be implemented as a sum-of-shifts. For example, $a=\frac{3}{8}=\frac{1}{8}+\frac{1}{4}$ is implemented by summing two shifted replicas of the multiplied sample. Utilizing this method, calculating a cycle of the template filter with $a=\frac{3}{8}$ requires only three additions.

The following table shows the total number of addition operations required to calculate a single cycle of interpolation filter 30 for different values of N. Two template filters are considered, having $a=\frac{1}{2}$ and $a=\frac{3}{8}$. The template filter assumed is the third-order half-band filter described above.

| N | Additions for coefficients 44 | Total additions $a = \frac{1}{2}$ | Total additions $a = \frac{3}{8}$ |
|---|---|---|---|
| 2 | 1 | 2 * 2 + 1 = 5 | 2 * 3 + 1 = 7 |
| 3 | 4 | 3 * 2 + 4 = 10 | 3 * 3 + 4 = 13 |
| 4 | 4 | 4 * 2 + 4 = 12 | 4 * 3 + 4 = 16 |
| 5 | 6 | 5 * 2 + 6 = 16 | 5 * 3 + 6 = 21 |

(The complexity figures given above are calculated at the lower (input) sampling rate. In terms of the output rate the complexity is equal to half of the figures given above. For example, 10 additions at the input rate correspond to only 5 additions at the output rate.)

Although the computational complexity calculations given herein refer to interpolation filters 30, similar arguments hold for decimation filters 54 too. Since coefficients 44 and template filters 40 remain unchanged in the transformation of interpolation to decimation, as explained hereinabove, a decimation filter has a similar (although not necessarily identical) computational complexity to the equivalent interpolation filter.

Exemplary Performance Results

FIG. 9 is a plot that schematically illustrates spectral responses of polyphase interpolation filters 30, in accordance with embodiments of the present invention. A curve 60 shows the spectral response of the third-order half-band filter described above, with a template filter having $a=\frac{1}{2}$. Only modest stop-band rejection of ~22 dB (in the worst-case stop-band frequency) is achieved, but the filter is extremely efficient to implement, as explained above.

A curve 62 shows the response for N=2, using the same template filter. It can be seen that the stop-band rejection is improved, reaching ~44 dB.

Cascading three stages (N=3) demonstrates the effectiveness of the disclosed method. In spite of the modest performance of the single-stage filter shown by curve 60, cascading three such filters provides a high worst-case rejection of ~66 dB, as shown by a curve 64. At the same time, this N=3, $a=\frac{1}{2}$ filter is extremely efficient to implement, requiring only 10 addition operations per cycle at the input rate or just 5 operations at the output rate.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An interpolation filter for interpolating a digital signal, comprising:

multiple template filters, which have respective inputs and outputs and an identical template transfer function A(z), which are connected in a cascade such that an input of a given template filter is connected to an output of another template filter that precedes the given template filter in the cascade, and which are arranged to receive and filter an input sequence representing the digital signal sampled at an input sampling rate;

ancillary circuitry, which is coupled to receive and process a first subset of the inputs and the outputs of the template filters to produce a first phase output, and to receive and process a second subset of the inputs and the outputs of the template filters, different from the first subset, to produce a second phase output; and a multiplexer, which is arranged to multiplex the phase outputs in order to generate an output sequence having an output sampling rate equal to twice the input sampling rate, wherein the ancillary circuitry is coupled to delay, scale and combine the inputs and outputs in the respective first and second subsets in order to produce the first and second phase outputs.

2. The interpolation filter according to claim 1, wherein the cascade comprises N template filters, and wherein the ancillary circuitry and multiplexer are arranged so that the interpolation filter has a transfer function $H(z)=[z^{-1}+A(z^2)]^N$.

3. The interpolation filter according to claim 1, wherein the ancillary circuitry is operative to scale each of the outputs in the first and second subsets by a multiplicative coefficient $$C_k = \binom{N}{k} = \frac{N!}{k!(N-k)!},$$

wherein k is an index indicating an order of the template filters in the cascade.

4. The interpolation filter according to claim 1, wherein the ancillary circuitry is operative to scale each of the outputs in the first and second subsets by performing one or more shift and add operations.

5. The interpolation filter according to claim 1, wherein the template filters and the ancillary circuitry are arranged to operate at the input sampling rate.

6. The interpolation filter according to claim 1, wherein the cascade, ancillary circuitry and multiplexer are implemented in an application-specific integrated circuit (ASIC).

7. The interpolation filter according to claim 1, wherein $A(z)=(a+z^{-1})/(1+az^{-1})$, wherein a is a constant.

8. A multistage interpolation filter for interpolating a digital signal, comprising two or more interpolation filters connected in series, the interpolation filters comprising at least:

a first interpolation filter, which comprises:

a first plurality of first template filters, which have respective first inputs and first outputs and an identical first stage template transfer function $A_1(z)$, which are connected in a first cascade such that a first input of a given first template filter is connected to a first output of another first template filter that precedes the given first template filter in the first cascade, and which are arranged to receive and filter an input sequence representing the digital signal sampled at an input sampling rate;

first ancillary circuitry, which is coupled to receive and process a first subset of the first inputs and the first outputs to produce a first phase output, and to receive and process a second subset of the first inputs and the first outputs, different from the first subset, to produce a second phase output; and a first multiplexer, which is arranged to multiplex the first and second phase outputs in order to generate a first output sequence having a first output sampling rate equal to twice the input sampling rate; and a second interpolation filter, which comprises:

a second plurality of second template filters, which have respective second inputs and second outputs and an identical second stage template transfer function $A_2(z)$, which are connected in a second cascade such that a second input of a given second template filter is connected to a second output of another second template filter that precedes the given second template filter in the second cascade, and which are arranged to receive and filter the first output sequence at the first output sampling rate;

second ancillary circuitry, which is coupled to receive and process a third subset of the second inputs and the second outputs to produce a third phase output, and to receive and process a fourth subset of the second inputs and the second outputs, different from the third subset, to produce a fourth phase output; and a second multiplexer, which is arranged to multiplex the third and fourth phase outputs in order to generate a second output sequence having a second output sampling rate equal to twice the first output sampling rate wherein at least the first and second stage template transfer functions are different from one other.

9. An analog front-end circuit for converting a digital discrete multi-tone (DMT) signal to an analog signal, comprising:

one or more interpolation filters, which are arranged to receive and interpolate the digital DMT signal so as to produce an interpolated signal, each interpolation filter comprising:

multiple template filters, which have respective inputs and outputs and an identical template transfer function $A(z)$, which are connected in a cascade such that an input of a given template filter is connected to an output of another template filter that precedes the given template filter in the cascade, and which are arranged to receive and filter an input sequence representing the digital signal sampled at an input sampling rate;

ancillary circuitry, which is coupled to receive and process a first subset of the inputs and the outputs of the template filters to produce a first phase output, and to receive and process a second subset of the inputs and the outputs of the template filters, different from the first subset, to produce a second phase output; and a multiplexer, which is arranged to multiplex the phase outputs in order to generate an output sequence having an output sampling rate equal to twice the input sampling rate; and a digital-to-analog converter, which is arranged to convert the interpolated signal to an analog signal, wherein the ancillary circuitry in each interpolation filter is coupled to delay, scale and combine the inputs and outputs in the respective first and second subsets in order to produce the first and second phase outputs.

10. The circuit according to claim 9, wherein the one or more interpolation filters comprise a plurality of the interpolation filters connected in series.

11. A method for interpolating a digital signal, comprising:

receiving an input sequence representing the digital signal sampled at an input sampling rate;

filtering the input sequence using multiple template filters, which are implemented in an Application Specific Integrated Circuit (ASIC) and have respective inputs and outputs and an identical template transfer function $A(z)$, and which are connected in a cascade such that an input of a given template filter is connected to an output of another template filter that precedes the given template filter in the cascade;

processing a first subset of the inputs and the outputs of the template filters to produce a first phase output, and processing a second subset of the inputs and the outputs of the template filters, different from the first subset, to produce a second phase output; and multiplexing the phase outputs in order to generate an output sequence having an output sampling rate equal to twice the input sampling rates, wherein processing the inputs and outputs in the respective first and second subsets comprises delaying, scaling and combining the inputs and outputs in the respective first and second subsets in order to produce the first and second phase outputs.

12. The method according to claim 11, wherein the cascade comprises N template filters, and wherein filtering the input sequence, processing the first and second subsets, and multiplexing the phase outputs result in applying a transfer function $H(z)=[z^{-1}+A(z^2)]^N$ to the input sequence.

13. The method according to claim 11, wherein scaling the inputs and outputs comprises scaling each of the outputs in the first and second subsets by a multiplicative coefficient $$C_k = \binom{N}{k} = \frac{N!}{k!(N-k)!},$$

wherein k is an index indicating an order of the template filters in the cascade.

14. The method according to claim 11, wherein scaling the inputs and outputs comprises scaling each of the outputs in the first and second subsets by performing one or more shift and add operations.

15. The method according to claim 11, wherein filtering the input sequence and processing the inputs and outputs are performed at the input sampling rate.

16. The method according to claim 11, wherein $A(z)=(a+z^{-1})/(1+az^{-1})$, wherein a is a constant.

* * * * *